(12) United States Patent
Qin

(10) Patent No.: US 11,394,382 B2
(45) Date of Patent: Jul. 19, 2022

(54) LOAD SWITCH CIRCUIT AND CONTROL METHOD

(71) Applicant: LEN Technology Limited, Wuxi (CN)

(72) Inventor: Song Qin, Wuxi (CN)

(73) Assignee: LEN Technology Limited, Wuxi (CN)

( * ) Notice: Subject to any disclaimer, the term of this patent is extended or adjusted under 35 U.S.C. 154(b) by 0 days.

(21) Appl. No.: 17/110,053

(22) Filed: Dec. 2, 2020

(65) Prior Publication Data

US 2022/0069818 A1    Mar. 3, 2022

(30) Foreign Application Priority Data

Aug. 31, 2020   (CN) .......................... 202010902947.7

(51) Int. Cl.
*H03K 17/687* (2006.01)
*H03K 17/16* (2006.01)
*H03K 17/082* (2006.01)

(52) U.S. Cl.
CPC ..... *H03K 17/6872* (2013.01); *H03K 17/0822* (2013.01); *H03K 17/163* (2013.01); *H03K 17/166* (2013.01); *H03K 17/687* (2013.01)

(58) Field of Classification Search
CPC ........... H03K 17/6872; H03K 17/6871; H03K 17/687; H03K 17/163; H03K 17/04206; H03K 17/0822; H03K 17/08; H03K 17/082; H03K 17/165; H03K 17/166
See application file for complete search history.

(56) References Cited

U.S. PATENT DOCUMENTS

2004/0032701 A1*   2/2004  Yoshida ............. H03K 17/0822
                                                                361/93.1

* cited by examiner

*Primary Examiner* — Jung Kim
(74) *Attorney, Agent, or Firm* — Seed IP Law Group LLP

(57) ABSTRACT

A load switch circuit includes a power transistor. A first terminal is configured to receive a power supply voltage, and a second terminal is the output terminal of the load switch circuit and is coupled with an external inductive load. A clamping module includes at least a mutually coupled clamping unit and a driving unit. The clamping unit includes a voltage-current converter and a first resistor, the first resistor coupled between the output terminal of the voltage-current converter and the second terminal of the power transistor. The positive input terminal of the voltage-current converter receives the power supply voltage, and the negative input terminal is coupled to the second terminal of the power transistor.

15 Claims, 3 Drawing Sheets

LOAD SWITCH CIRCUIT AND CONTROL METHOD

BACKGROUND

Technical Field

This application relates to the field of electrical control, and in particular relates to a load switch circuit and a control method thereof.

Description of the Related Art

Load switch circuits are widely used in high-voltage equipment such as automotive electronics and gas water heaters. When driving a relatively large inductive load, after the switch is turned off, it is necessary to provide freewheeling path for inductive current. FIG. 1 is a schematic diagram of an existing circuit that uses a switch external circuit structure to realize inductive freewheeling. After the power transistor is turned off, current continues to flow through the inductor, and the potential at the output node is pulled down to a very large negative potential, which may cause the power transistor to break down. A freewheeling diode D with the anode coupled to ground potential and the cathode coupled to the external load inductance prevents the output node potential from being severely pulled down. However, since the voltage drop on the forwarded freewheeling diode is only about 0.7V, the discharge speed of the inductive load current is relatively slow.

FIG. 2 is a schematic diagram of an existing circuit that utilizes the internal circuit structure of a load switch to implement inductive freewheeling. The circuit provides a mechanism for clamping the output voltage inside the load switch circuit. However, as shown in the figure, clamping the output voltage of the load switch circuit is achieved by one or more diodes connected in series. Therefore, the smallest unit for adjusting the clamping voltage in this mechanism is the breakdown voltage of a single diode, such as 5V.

BRIEF SUMMARY

The present application provides a load switch circuit including a power transistor and a clamping module. A first terminal of the power transistor is configured to receive the power supply voltage, and a second terminal is the output terminal of the load switch circuit and is coupled to an external inductive load. The clamping module includes at least a clamping unit and a driving unit coupled together. The clamping unit includes a voltage-current converter and a first resistor, and the first resistor is coupled to the output terminal of the voltage-current converter and the power transistor. The positive input terminal of the voltage-current converter is configured to receive the power supply voltage, and the negative input terminal is coupled to the second terminal of the power transistor. The current output of the voltage-current converter generates a reference voltage drop on the first resistor. The output terminal of the driving unit is coupled to the control electrode of the power transistor. When the difference between the power supply voltage and the output voltage of the power transistor is greater than or equal to the preset clamping threshold, the clamping unit is configured to output an effective driving control signal to the driving unit, and the driving unit outputs an effective driving signal to turn on the power transistor. The preset clamping threshold is the sum of the reference voltage drop and the threshold voltage of the first transistor.

In some embodiments, the proposed load switch circuit further includes a driving unit comprising a first transistor. The control electrode of the first transistor is coupled to the output terminal of the voltage-current converter, the second electrode is coupled to the control electrode of the power transistor, and the first electrode of which is configured to receive the power supply voltage. A first resistive branch is coupled between the second electrode of the first transistor and the second electrode of the power transistor, and the type of the first transistor is complementary to the type of power transistor.

In some embodiments, the proposed clamping module further comprises a trigger unit configured to receive the output voltage of the power transistor. When the output voltage is lower than the ground potential, the power supply voltage is supplied to the clamping unit.

In some embodiments, the proposed clamping unit further comprises a first diode (ZD3) and a second transistor (MP2), wherein the cathode of the first diode (ZD3) is configured to receive the power supply voltage, the anode of the first diode (ZD3) is coupled to the control electrode of the second transistor (MP2), the first electrode of the second transistor (MP2) is coupled to the second electrode of the power transistor, and the second transistor (MP2) is coupled to the negative input terminal of the voltage-current converter; and the positive input terminal of the voltage-current converter is configured to receive the power supply voltage, wherein a second resistive branch is coupled between the control electrode of the second transistor (MP2) and the second terminal of the power transistor (MN3), and the type of second transistor (MP2) is of the same type as the first transistor (MP4).

In some embodiments, the proposed second resistive branch includes a second resistor (R3) coupled between the control electrode of the second transistor (MP2) and the second terminal of the power transistor (MN3).

In some embodiments, the proposed clamping unit further comprises a third transistor (MP3), the control electrode of which is coupled to the control electrode of the second transistor (MP2), and the first resistor (R4) is coupled between the first electrode of the third transistor (MP3) and the second electrode of the power transistor (MN3), and the second electrode of the third transistor (MP3) is coupled to the output terminal of the voltage-current converter, wherein the type of the third transistor (MP3) is the same as the type of the second transistor (MP2).

In some embodiments, the proposed trigger unit comprises a fourth transistor (MN2), a fifth transistor (MN1) and a sixth transistor (MP1) wherein the control electrode of the fourth transistor (MN2) is configured to receive a clamp control signal, the first electrode of which is coupled to the control electrode of the fifth transistor (MN1), and the second electrode is configured to receive ground potential; the first electrode of the fifth transistor (MN1) is coupled to the control electrode of the sixth transistor (MP1), and the second electrode is coupled to the second electrode of the power transistor (MN3), a third resistive branch is coupled between the fifth transistor (MN1) and the second electrode of the power transistor (MN3); the first electrode of the sixth transistor (MP1) is coupled to the positive input terminal of the voltage-current converter, and the second electrode is configured to receive the power supply voltage.

In some embodiments, the proposed trigger unit further comprises a second diode (ZD1), the cathode of which is configured to receive the power supply voltage, and the anode of which is coupled to the control electrode of the sixth transistor (MP1).

In some embodiments, the proposed trigger unit further comprises a third resistor (R1) coupled between the control electrode and the second electrode of the sixth transistor (MP1).

In some embodiments, the proposed trigger unit further comprises a third diode (ZD2) whose cathode is coupled to the control electrode of the fifth transistor (MN1), and whose anode is coupled to the second electrode of the fifth transistor (MN1).

In some embodiments, the proposed third resistive branch includes a fourth resistor (R2) coupled between the second electrode of the fifth transistor and the second electrode of the power transistor in between.

In some embodiments, the proposed first resistive branch includes a fifth resistor (R5) coupled between the control electrode and the second electrode of the power transistor (MN3).

The present application further proposes an electronic device comprising the load switch circuit according to the previous description.

The present application further proposes a control method of a switch circuit, including setting the equivalent resistance of the voltage-current converter inside the switch circuit to generate a reference current; generating a preset clamping threshold based on at least the reference voltage generated by the reference current on the reference resistor; and when the difference between the power supply voltage and the output voltage of the switching circuit is greater than or equal to the preset clamping threshold, the power transistor coupled to the load inside the switching circuit is turned on, thereby providing a freewheeling path for the inductive load current.

In some embodiments, the proposed control method further comprises when the output voltage of the switch circuit is lower than the ground level, the power supply voltage is provided to the voltage-current converter.

The proposed load switch circuit in the present application provides a clamping module located inside the switch circuit and a freewheeling path for the inductive load current through the power transistors in the switch circuit. Furthermore, a voltage-current converter is used to generate the reference voltage on the reference resistor to form the clamp threshold, this is a simple flexible mechanism for the adjustment of the clamp threshold. In addition, this application also provides a mechanism to automatically trigger the clamp function when the output voltage of the switch circuit is lower than the ground level, so that the clamp module is in a power-off state when the output voltage is not pulled to a negative value, this reduces the overall power consumption of the circuit.

BRIEF DESCRIPTION OF THE SEVERAL VIEWS OF THE DRAWINGS

The embodiments are shown and explained with reference to the drawings. These drawings are used to clarify the basic principle, so that only aspects necessary for understanding the basic principle are shown. The drawings are not to scale. In the drawings, the same reference numerals indicate similar features.

DETAILED DESCRIPTION

Figure 1:
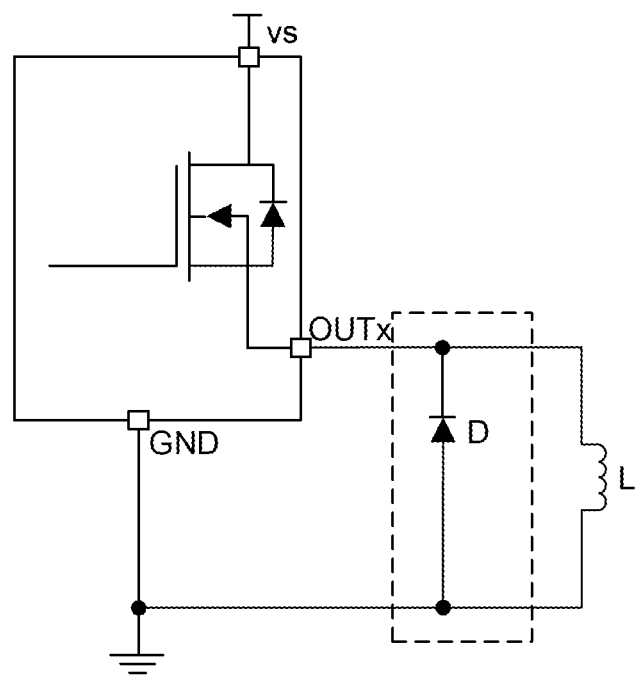
FIG. 1 is a schematic diagram of an existing circuit that uses a switch external circuit structure to realize inductive current freewheeling.
Figure 2:
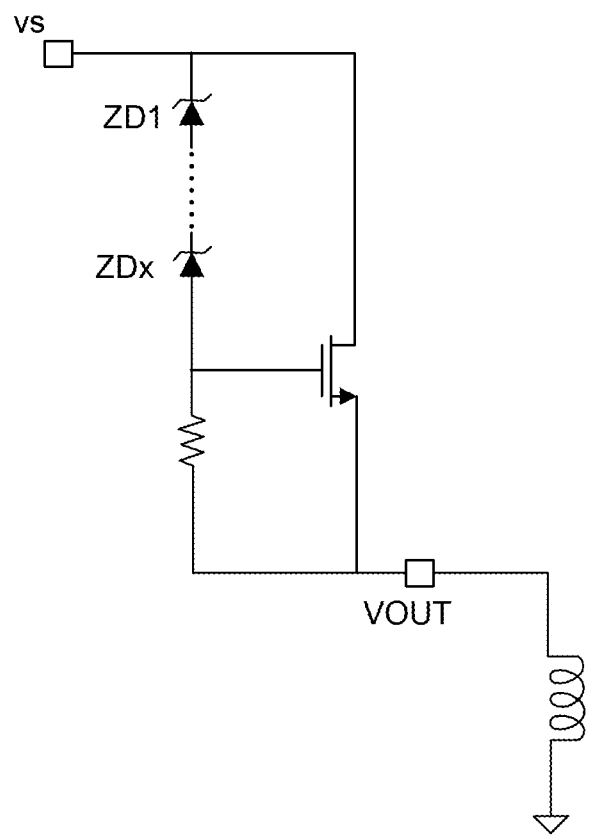
FIG. 2 is a schematic diagram of an existing circuit that uses the internal circuit structure of a load switch to implement inductive current freewheeling.

In the following detailed description of the preferred embodiments, reference will be made to the accompanying drawings that constitute a part of this application. The attached drawings show specific embodiments that can implement the present application by way of example. The exemplary embodiments are not intended to be exhaustive of all embodiments according to this application. It can be understood that without departing from the scope of the present application, other embodiments can be used, and structural or logical modifications can also be made. Therefore, the following detailed description is not restrictive, and the scope of the present application is defined by the appended claims.

The technologies, methods, and equipment known to those of ordinary skill in the relevant fields may not be discussed in detail, but where appropriate, the technologies, methods, and equipment should be regarded as part of the specification. The connection between the units in the drawings is only for convenience of description, which means that at least the units at both ends of the connection communicate with each other, and it is not intended to limit the communication between unconnected units.

In the following detailed description, reference may be made to the drawings of each specification used as a part of this application to illustrate specific embodiments of the application. In the drawings, similar reference numerals describe substantially similar components in different drawings. Each specific embodiment of the present application is described in sufficient detail below, so that a person of ordinary skill with relevant knowledge and technology in the field can implement the technical solution of the present application. It should be understood that other embodiments can also be used or structural, logical or electrical changes can be made to the embodiments of this application.

The transistor in this application, if not specifically indicated otherwise, may be an NMOS or PMOS transistor, and may include a control electrode, a first electrode (drain or source), and a second electrode (source or drain). The drain and source of the transistor in the embodiments of the present application can be exchanged according to the transistor type or the bias state. Other suitable transistors, such as NPN or PNP bipolar junction transistors, may also be used and are included in the scope of the disclosure.

The following defines the high voltage level as the asserted logic state and the low voltage level as the de-asserted logic state. Of course, the use of complementary transistors to replace the circuits formed in the embodiments herein also belongs to the protection scope of the present application.

This application proposes a load switch circuit, in which the circuits that clamp the output voltage are located inside the load switch circuit, and the clamp voltage can be flexibly changed or adjusted.

Figure 3:
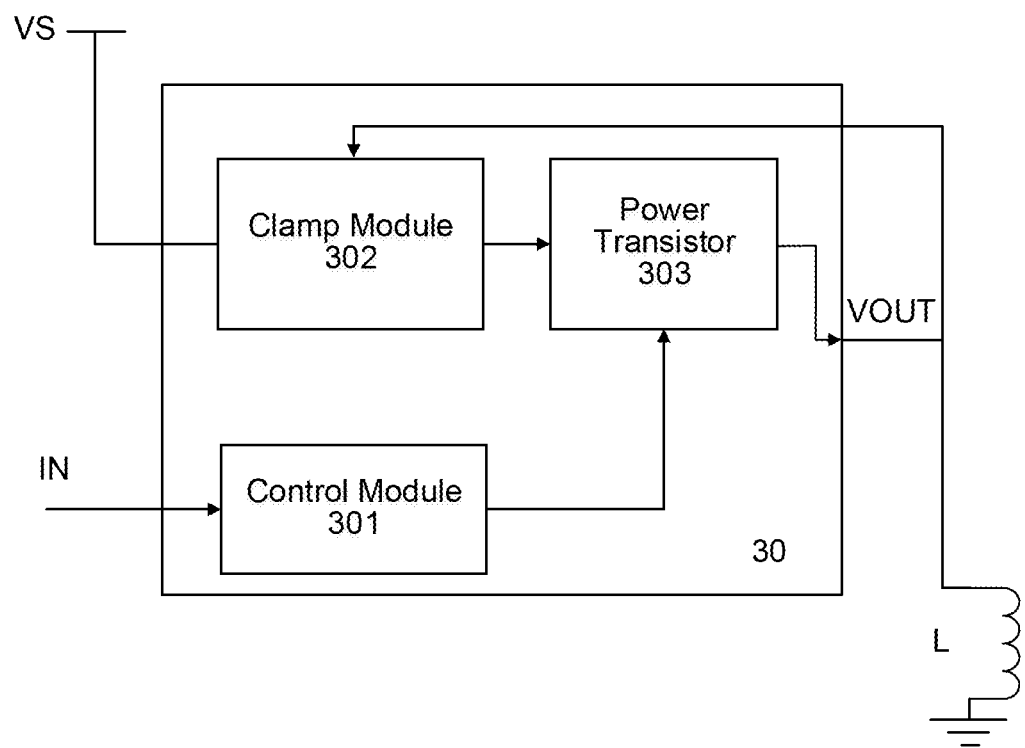
FIG. 3 is a schematic diagram of a load switch module according to some embodiments of the present application.

FIG. 3 is a block diagram of a load switch according to embodiments of the present application. As shown in the figure, the load switch 30 may include a switch control module 301, configured to receive an input signal IN for controlling the state of the switch, and control the power transistor 303 to turn on or off based on at least the input signal IN. The power switch 30 may also include an output clamp module 302, configured to receive the output signal VOUT of the power transistor 303 and activate the clamping function when VOUT reaches a preset clamping threshold to limit the drain-source voltage difference of the power transistor 303. As a result, the output signal VOUT of the power transistor 303 is prevented from pulling down to a level that causes the power transistor 303 to break down. The load switch 30 may also include a power transistor 303 configured to realize the function of a power switch.

Figure 4:
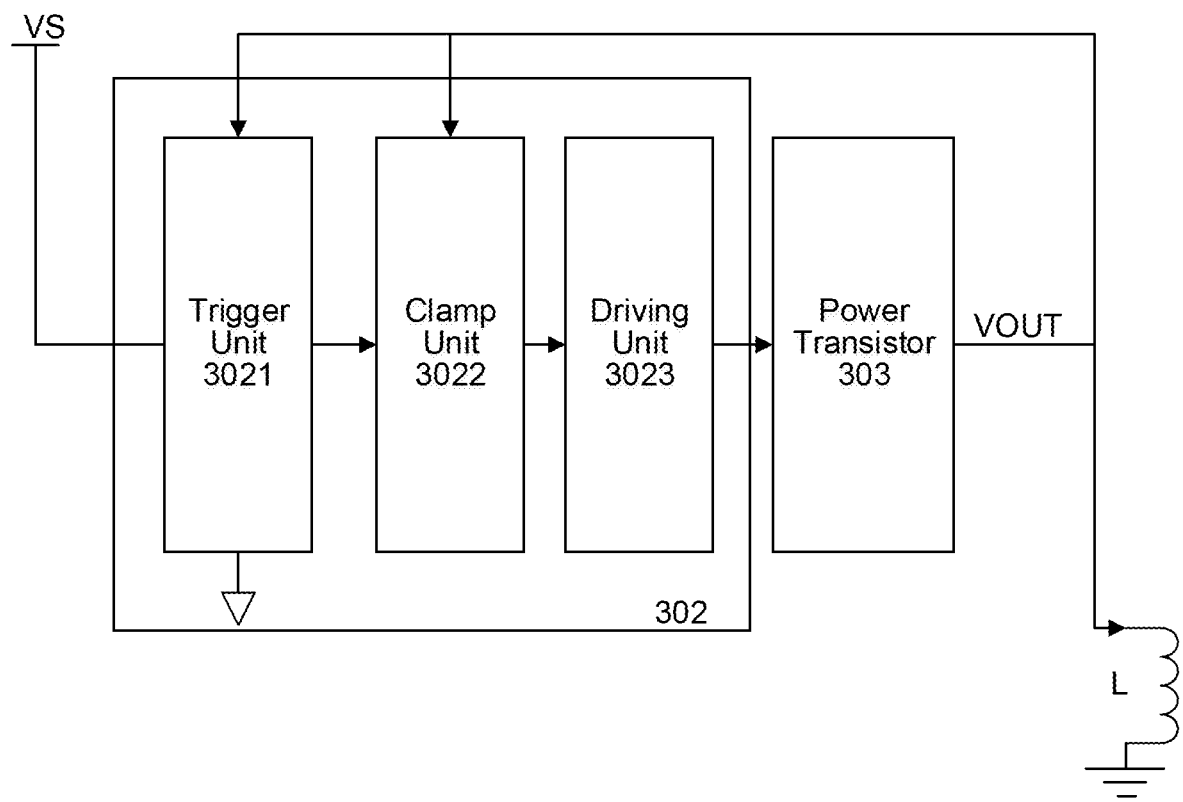
FIG. 4 is a schematic diagram of a partial module of a load switch according to some embodiments of the present application.

FIG. 4 is a schematic diagram of a portion of a load switch according to some embodiments of the present application. As shown in the figure, the clamping module 302 may include a trigger unit 3021, a clamping unit 3022, and a driving unit 3023. Among them, the trigger unit 3021 is configured to receive the output voltage VOUT of the power transistor 303, and is triggered to start when VOUT turns into negative, and provides the power supply voltage VS to the clamping unit 3022. The clamping unit 3022 outputs a driving control signal to the driving module 3023 when VOUT is pulled down below a preset threshold. The drive module 3023 outputs a clamping signal under the action of the drive control signal, so that the power transistor 303 is turned on, assists the load inductance L to release current, and clamps the output voltage to a fixed potential. As the current in the load inductance is gradually reduced, the output voltage VOUT will return to the ground level.

Figure 5:
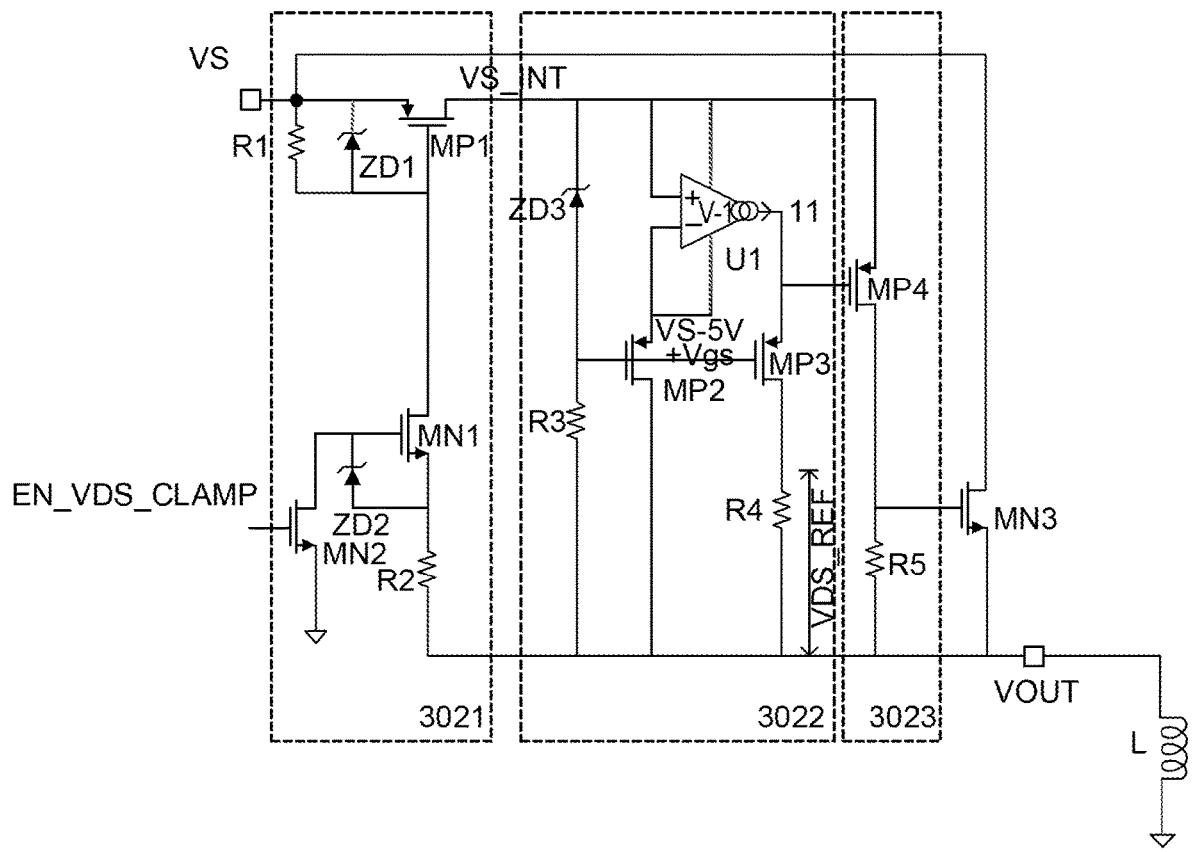
FIG. 5 is a schematic partial circuit diagram of a load switch according to some embodiments of the present application.

FIG. 5 is a schematic diagram of a portion of a load switch according to some embodiments of the present application. As shown in the figure, the load switch may include, for example, an N-type power transistor MN3. FIG. 5 shows details of the clamp module 302, and the switch control module 301 is not shown in FIG. 5 for simplicity purposes. Those skilled in the art know that the circuit described below is only one example embodiment, and the scope of the present application is not limited to this example embodiment. Those skilled in the art also know that a circuit obtained by merely changing the type of MOS transistor, e.g., in a complementary manner, is still within the scope of this application.

According to some embodiments, the trigger unit 3021 may include, for example, an N-type transistor MN1, and an N-type transistor MN2. The gate of MN2 is configured to receive the clamp module control signal EN_VDS_CLAMP. This clamp module control signal is valid only when the power transistor 303 is in the off or non-working state, and the entire clamp module is activated when EN_VDS_CLAMP is valid.

According to some embodiments, the drain of MN2 is coupled to the gate of transistor MN1, and its source is configured to receive a low voltage potential, e.g., the ground potential. The source of the transistor MN1 is coupled to the source of the power transistor 303 and is configured to receive the output voltage VOUT of the power switch. According to some embodiments, the trigger unit 3021 may further include a resistor R2 coupled between the source of the transistor MN1 and the output terminal of the power transistor, which functions to prevent the transistor MN1 from being burnt down by an excessive gate-source voltage. Of course, other structures can also be used to form this resistive branch.

According to some embodiments, the trigger unit 3021 may further include a P-type transistor MP1, the source of which is configured to receive the power supply voltage VS, and the drain of which is coupled to the clamping unit 3022 for providing the clamping unit with the power voltage VS_INT. According to some embodiments, the trigger unit 3021 may further include a Zener diode ZD1. The anode of the Zener diode ZD1 is coupled to the gate of the transistor MP1, and the cathode of the Zener diode ZD1 is coupled to the source of the transistor MP1. The trigger unit 3021 may also include a resistor R1 connected in parallel with ZD1.

According to some embodiments, when EN_VDS_CLAMP is at a valid level, e.g., a high level, for example, the transistor MN2 is turned on, the clamp module is activated, and the gate of the transistor MN1 is configured to receive the ground level through the turned-on transistor MN2. Therefore, when the load switch 30 is turned off and the inductive load L pulls down the output voltage VOUT to a negative voltage, the transistor MN1 is turned on. The turn on of transistor MN1 can provide the output voltage VOUT to the gate of the transistor MP1. In this case, the gate potential of the transistor MP1 is lower than its source potential VS, so the transistor MP1 is turned on. The power supply voltage is supplied to the clamping unit 3022 as VS_INT.

According to some embodiments, the reverse breakdown voltage of the Zener diode ZD1 may be, for example, 5V. When the voltage difference between VOUT and VS is greater than or equal to 5V, the Zener diode ZD1 may be broken down to form a conductive path, thereby providing protection for the transistor MP1. The role of R1 is to ensure that MP1 can be turned off completely when MP1 is in the closed state.

Based on the above-mentioned structure and operation mode of the trigger unit 3021, the clamping unit 3022 cannot receive the power supply voltage when the output of the load switch is not lower than the low level at the source of N-type transistor MN2, e.g., the ground level, so this solution reduces the overall power consumption of the clamp module 3022. Of course, regardless of power consumption, according to other embodiments, the trigger unit 3021 can also be used only to receive the clamping module control signal, and regardless of the value of the output voltage VOUT of the load switch circuit, the clamping unit 3022 may also be always coupled to the supply voltage.

According to some embodiments, the clamping unit 3022 may include a voltage-current converter V-I, a P-type transistor MP2, a Zener diode ZD3, and a resistor R3. The cathode of the Zener diode ZD3 is configured to receive VS_INT (VS_INT=VS), and its anode is coupled to the gate of the transistor MP2. The resistor R3 is coupled between the gate of the transistor MP2 and the output terminal of the load switch circuit. The drain of the transistor MP2 is also coupled to the output terminal of the load switch circuit for receiving VOUT. Both the positive input terminal and a control terminal of the voltage-current converter V-I are configured to receive the power supply voltage VS_INT, and the negative input terminal and the other control terminal are both coupled to the source of the transistor MP2.

According to some embodiments, the clamping unit 3022 may further include a P-type transistor MP3 and a resistor R4. The gate of the transistor MP3 is coupled to the gate of the transistor MP2, and the source is coupled to the output terminal of the voltage-current converter V-I. The resistor R4 is coupled between the drain of the transistor MP3 and the output terminal of the load switch circuit.

According to some embodiments, the breakdown voltage of the Zener diode ZD3 may be 5V. When VS_INT−VOUT−VR3 is greater than or equal to 5V, Zener diode ZD3 is broken down, the gate voltage of transistor MP2 is VS_INT-5V, and the source voltage of transistor MP2 is VS_INT-5V+Vsg, where Vsg is the source gate voltage of the transistor MP2 and VR3 is a voltage drop on the resistor R3.

According to some embodiments, the voltage difference between the positive input terminal and the negative input terminal of the voltage-current converter V-I may be 5V-Vsg, and the equivalent resistance converted by the voltage-current converter V-I may be Rx. Therefore, the current I1 output at the output terminal of the voltage-current converter V-I can be expressed as (5V-Vsg)/Rx. The user can adjust the value of Rx as needed to adjust the clamping effect, that is, the lowest voltage value allowed for VOUT to be pulled down.

Generally, the devices in the voltage-current converter V-I are low-voltage devices, so the voltage difference at the input terminals generally does not exceed 5V. Since VS and VS_INT are high voltages, such as 40V, the voltage-current converter V-I cannot be directly grounded to prevent damaging of the voltage devices. In some embodiments, by setting the Zener diode ZD3, the difference of the input signal of the voltage-current converter is effectively adjusted to within 5V. In addition, the source-drain withstand voltage of the transistor MP2 is much higher than the voltage devices inside the voltage-current converter V-I, so MP2 provides an appropriate grounding path for the voltage-current converter V-I.

ZD3, R3, and transistor MP2 are all set to be able to convert the high voltage signal of the power supply voltage into an acceptable voltage level for the voltage-current converter. Other structures can also be used instead of R3 to realize resistive branches. According to different embodiments, circuits that use other structures to implement the function of adjusting the input voltage of the voltage-current converter are also within the protection scope of the present application.

According to some embodiments, when the source gate voltage of the transistor MP3 is greater than or equal to its threshold voltage, MP3 is turned on, and its source and drain voltages are equal when it is turned on, and the current I1 flows through the resistor R4 and generates a voltage across it. Therefore, either the voltage at the source or the one at the drain of the transistor MP3 can be regarded as VDS_REF+VOUT, where VDS_REF=(5V-Vsg)*R4/Rx. The source voltage VDS_REF+VOUT of the transistor MP3 is the driving control signal output to the driving unit 3023.

According to some embodiments, the driving unit 3023 may include a P-type transistor MP4 and a resistor R5. The source of the transistor MP4 can be configured to receive VS_INT, and its gate is coupled to the source of the transistor MP3. The resistor R5 is coupled between the drain of the transistor MP4 and the output terminal of the load switch. When the source to gate voltage (VS_INT)−(VDS_REF)−VOUT of the transistor MP4 is greater than or equal to the threshold voltage Vth of the transistor MP4, the transistor MP4 is turned on.

According to some embodiments, when VOUT drops so that the voltage of VDS_CLAMP=VS_INT−VOUT exceeds VDS_REF+Vth, the preset clamping threshold, the transistor MP4 is turned on and the power supply voltage VS_INT is provided to, for example, the gate of the N-type power transistor MN3. Vth is the threshold voltage of transistor MP4. In this case, the power transistor MN3 is turned on, and current flows through the power transistor MN3 and the inductive load, thereby assisting the inductor to discharge current. According to some embodiments, the value of R4 may be in the order of 10 kOhms to 1 MOhm. The value of Rx can be calculated based on the desired VDS_CLAMP.

According to some embodiments, the transistor MP4 is coupled to the output terminal of the switch through a resistor R5. Of course, other methods can be used instead of R5 to form a resistive branch.

After the inductor current is discharged, VOUT is pulled up to 0V, the transistor MN1 is turned off, the transistor MP1 is also turned off, the clamping unit 3022 does not receive the power supply voltage VS, so it is in no power consumption status.

As the load inductance discharges current, the power transistor MN3 is not completely turned on as in the normal working state, it only sets a corresponding gate-source voltage according to the magnitude of the current that needs to be discharged, as a result, VOUT is not pulled up to VS_INT. Therefore, there is no confusion with the normal working state of MN3. At the same time, due to the reuse of the power transistor MN3, a clamping mechanism inside the load switch is provided, this outperforms the solution with external clamping diodes and avoids the inability to dynamically adjust the clamping threshold.

This application provides a solution for realizing a freewheeling path for an inductive load by using the internal structure of the load switch. In this solution, a voltage-current converter is used to generate a reference current and then a reference voltage is generated on the reference resistor, thereby forming a clamping threshold. By reusing the power transistor, the current of the inductive load is discharged. Based on this solution, users can flexibly adjust the clamp threshold according to the actual current that needs to be discharged, to achieve precise control of the discharge.

Figure 6:
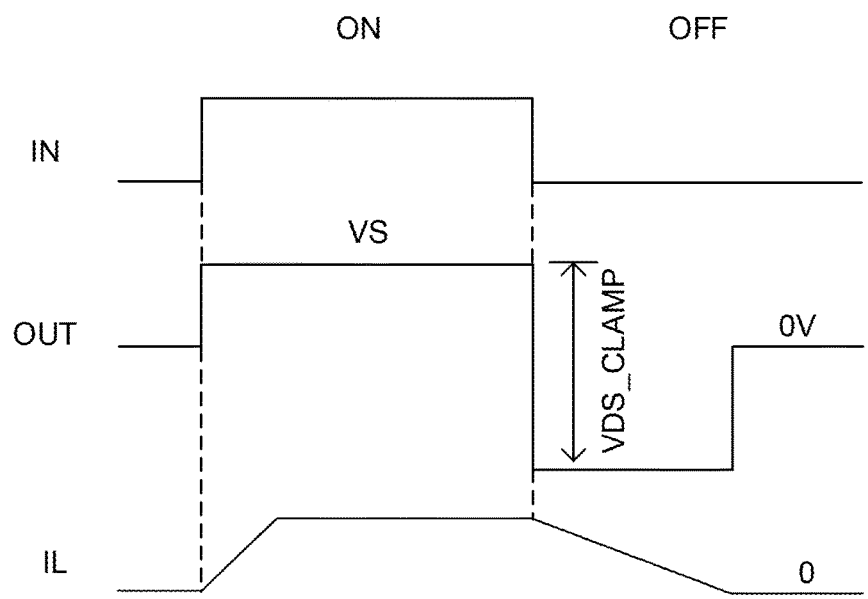
FIG. 6 shows a working sequence diagram of a load switch according to some embodiments of the present application.

FIG. 6 is a schematic diagram of a timing sequence of a load switch circuit according to some embodiments of the present application. As shown in the figure, when the load switch circuit is in the off state, the output voltage VOUT is pulled down to a negative value, but the pull-down amplitude is limited to VDS_CLAMP. This prevents VOUT of the switching circuit from being pulled down to an excessively negative potential.

According to some embodiments, the present application also provides a control method of a load switch circuit, including setting the equivalent resistance of the voltage-current converter inside the load switch circuit to generate a reference current; the reference current produces a reference voltage across the reference resistor, thus generates a preset clamping threshold; and when the difference between the power supply voltage and the output voltage of the switching circuit is greater than or equal to the preset clamping threshold, the power transistor is turned on, thereby freewheeling the inductive load.

According to some embodiments, the method further includes providing a power supply voltage to the voltage-current converter when the output voltage of the switching circuit is lower than the ground level.

Therefore, although the present application has been described with reference to specific examples, where these specific examples are only intended to be exemplary and not to limit the application, it is obvious to those of ordinary skill in the art that without departing from the spirit and scope of the application, the disclosed embodiments may be changed, added, or deleted.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the description herein, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The various embodiments described above can be combined to provide further embodiments. Aspects of the embodiments can be modified to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A load switch circuit, comprising:
a power transistor, a first terminal of the power transistor configured to receive a power supply voltage, and a second terminal of the power transistor configured to be an output terminal of the load switch circuit and configured to be coupled to an external inductive load; and
a clamping module including a clamping unit and a driving unit coupled together, wherein the clamping unit includes a voltage-current converter and a first resistor, the first resistor coupled between an output terminal of the voltage-current converter and the second terminal of the power transistor, a positive input terminal of the voltage-current converter coupled to receive the power supply voltage, a negative input terminal of the voltage-current converter coupled to the second terminal of the power transistor, a current output of the voltage-current converter generating a reference voltage drop on the first resistor, and an output terminal of the driving unit is coupled to a control electrode of the power transistor.

2. The circuit of claim 1, wherein the first resistor is coupled to the control electrode of the power transistor via a first transistor, and
wherein, in response to a difference between the power supply voltage and an output voltage at second terminal of the power transistor being greater than or equal to a clamping threshold, the clamping unit is configured to output a driving control signal to the driving unit, based on which the driving unit outputs a driving signal to turn on the power transistor, the clamping threshold being a sum of the reference voltage drop and a threshold voltage of the first transistor.

3. The circuit of claim 1, wherein the driving unit comprises:
a second transistor, a control terminal of the second transistor coupled to the output terminal of the voltage-current converter, and a first terminal of the second transistor coupled to a control terminal of the power transistor, a second terminal of the second transistor coupled to receive the power supply voltage; and
a first resistive branch coupled between the first terminal of the second transistor and the second terminal of the power transistor.

4. The circuit of claim 3, wherein a type of the second transistor is complementary to a type of power transistor.

5. The circuit of claim 1, wherein the clamping module further comprises a trigger unit configured to receive an output voltage at the output terminal of the power transistor, and in response to the output voltage is lower than a threshold low potential, the trigger unit controls the power supply voltage to be supplied to the clamping unit.

6. The circuit of claim 3, wherein the clamping unit further comprises a first diode and a third transistor, wherein a cathode of the first diode is coupled to receive the power supply voltage, an anode of the first diode is coupled between a control electrode of the third transistor and the power supply voltage, a first electrode of the third transistor is coupled to a second electrode of the power transistor, and the third transistor is coupled to the negative input terminal of the voltage-current converter, and wherein, a second resistive branch is coupled between the control electrode of the third transistor and the second terminal of the power transistor, and a type of third transistor is of a same type as the second transistor.

7. The circuit of claim 6, wherein the second resistive branch includes a second resistor coupled between the control electrode of the third transistor and the second terminal of the power transistor.

8. The circuit of claim 7, wherein the clamping unit further comprises a fourth transistor, wherein:
the control electrode of the fourth transistor is coupled to the control electrode of the third transistor,
the first resistor is coupled between the first electrode of the fourth transistor and the second electrode of the power transistor,
the second electrode of the fourth transistor is coupled to the output terminal of the voltage-current converter, and
a type of the fourth transistor is the same as a type of the third transistor.

9. The circuit of claim 5, wherein the trigger unit comprises a fourth transistor, a fifth transistor, a sixth transistor and a third resistive branch, wherein
a control electrode of the fourth transistor is coupled to receive a clamp control signal, a first electrode of the fourth transistor is coupled to a control electrode of the fifth transistor, and a second electrode of the fourth transistor is coupled to receive a potential,
a first electrode of the fifth transistor is coupled to a control electrode of the sixth transistor, and a second electrode of the fifth transistor is coupled to the second electrode of the power transistor, and the third resistive branch is coupled between the fifth transistor and the second electrode of the power transistor, and
a first electrode of the sixth transistor is coupled to the positive input terminal of the voltage-current converter, and the second electrode is configured to receive the power supply voltage.

10. The circuit of claim 9, wherein the trigger unit further comprises a second diode, a cathode of the second diode is coupled to receive the power supply voltage, and an anode of second diode is coupled to the control electrode of the sixth transistor.

11. The circuit of claim 10, wherein the trigger unit further comprises a third resistor coupled between the control electrode and the second electrode of the sixth transistor.

12. The circuit of claim 11, wherein the trigger unit further comprises a third diode, a cathode of the third diode coupled to the control electrode of the fifth transistor, and an anode of the third diode coupled to the second electrode of the fifth transistor.

13. The circuit of claim 12, wherein the third resistive branch includes a fourth resistor coupled between the second electrode of the fifth transistor and the second electrode of the power transistor in between.

14. The circuit of claim 3, wherein the first resistive branch includes a fifth resistor coupled between the control electrode and a second electrode of the power transistor.

15. An electronic device, comprising:
an inductive load; and
a load switch circuit, the load switch circuit including:
a power transistor, a first terminal of the power transistor configured to receive a power supply voltage, and a second terminal of the power transistor configured to be an output terminal of the load switch circuit and configured to be coupled to the inductive load; and
a clamping module including a clamping unit and a driving unit coupled together, wherein the clamping unit includes a voltage-current converter and a first resistor, the first resistor coupled between an output terminal of the voltage-current converter and the second terminal of the power transistor, a positive input terminal of the voltage-current converter coupled to receive the power supply voltage, a negative input terminal of the voltage-current converter coupled to the second terminal of the power transistor, a current output of the voltage-current converter generating a reference voltage drop on the first resistor; and an output terminal of the driving unit is coupled to a control electrode of the power transistor.

* * * * *